(12) United States Patent
Redaelli et al.

(10) Patent No.: US 8,962,384 B2
(45) Date of Patent: Feb. 24, 2015

(54) MEMORY CELLS HAVING HEATERS WITH ANGLED SIDEWALLS

(75) Inventors: Andrea Redaelli, Casatenovo (IT); Giorgio Servalli, Fara Gera d'Adda (IT); Pietro Petruzza, Pessano con Bornago (IT); Cinzia Perrone, Bellusco (IT)

(73) Assignee: Micron Technology, Inc., Boise, ID (US)

( * ) Notice: Subject to any disclaimer, the term of this patent is extended or adjusted under 35 U.S.C. 154(b) by 261 days.

(21) Appl. No.: 13/354,966

(22) Filed: Jan. 20, 2012

(65) Prior Publication Data

US 2013/0187120 A1 Jul. 25, 2013

(51) Int. Cl.
*H01L 21/06* (2006.01)
*H01L 45/00* (2006.01)

(52) U.S. Cl.
CPC ............ *H01L 45/065* (2013.01); *H01L 45/124* (2013.01)
USPC ......................... 438/102; 257/5; 257/E45.002

(58) Field of Classification Search
CPC ..... H01L 45/06; H01L 45/065; H01L 45/124; H01L 45/126; H01L 45/1675
USPC ................. 438/102; 257/5, E45.002
See application file for complete search history.

(56) References Cited

U.S. PATENT DOCUMENTS

| | | | |
|---|---|---|---|
| 6,617,192 B1 * | 9/2003 | Lowrey et al. | 438/95 |
| 7,348,590 B2 | 3/2008 | Happ | |
| 7,405,964 B2 | 7/2008 | Philipp et al. | |
| 7,714,315 B2 | 5/2010 | Happ et al. | |
| 7,791,058 B2 * | 9/2010 | Liu | 257/2 |
| 2005/0003602 A1 * | 1/2005 | Lowrey et al. | 438/202 |
| 2007/0232015 A1 * | 10/2007 | Liu | 438/396 |
| 2007/0238226 A1 * | 10/2007 | Lowrey | 438/131 |
| 2008/0044632 A1 * | 2/2008 | Liu et al. | 428/192 |
| 2008/0203374 A1 * | 8/2008 | Chuo et al. | 257/2 |
| 2008/0237565 A1 | 10/2008 | Chang | |
| 2008/0311699 A1 * | 12/2008 | Chen et al. | 438/102 |
| 2009/0166603 A1 * | 7/2009 | Lung | 257/4 |
| 2009/0321764 A1 * | 12/2009 | Lee et al. | 257/98 |
| 2010/0186663 A1 * | 7/2010 | Farr | 118/45 |
| 2010/0190321 A1 * | 7/2010 | Oh et al. | 438/478 |
| 2010/0308296 A1 | 12/2010 | Pirovano et al. | |
| 2011/0001111 A1 | 1/2011 | Breitwisch et al. | |
| 2011/0250729 A1 * | 10/2011 | Lai et al. | 438/382 |
| 2011/0291064 A1 * | 12/2011 | Marsh et al. | 257/4 |
| 2012/0126196 A1 * | 5/2012 | Pio | 257/4 |
| 2012/0261828 A1 * | 10/2012 | Bruce et al. | 257/774 |

(Continued)

OTHER PUBLICATIONS

Servalli, G. "A 45nm Generation Phase Change Memory Technology", Electron Devices Meeting (IEDM), 2009 IEEE International, Dec. 7-9, 2009 (4 pp.).

*Primary Examiner* — Joseph C Nicely
(74) *Attorney, Agent, or Firm* — Brooks, Cameron & Huebsch, PLLC (57) ABSTRACT

Memory cells having heaters with angled sidewalls and methods of forming the same are described herein. As an example, a method of forming an array of resistive memory cells can include forming a first resistive memory cell having a first heater element angled with respect to a vertical plane, forming a second resistive memory cell adjacent to the first resistive memory cell and having a second heater element angled with respect to the vertical plane and toward the first heater, and forming a third resistive memory cell adjacent to the first resistive memory cell and having a third heater element angled with respect to the vertical plane and away from the first heater element.

21 Claims, 8 Drawing Sheets

(56) References Cited

U.S. PATENT DOCUMENTS

| | | | |
|---|---|---|---|
| 2013/0140513 A1* | 6/2013 | Lai et al. | 257/4 |
| 2013/0234100 A1* | 9/2013 | An et al. | 257/4 |
| 2013/0248811 A1* | 9/2013 | Ren | 257/4 |
| 2013/0302966 A1* | 11/2013 | Oh et al. | 438/382 |
| 2014/0027704 A1* | 1/2014 | Hwang | 257/4 |

* cited by examiner

MEMORY CELLS HAVING HEATERS WITH ANGLED SIDEWALLS

TECHNICAL FIELD

The present disclosure relates generally to semiconductor memory apparatuses and methods, and more particularly to memory cells having heaters with angled sidewalls.

BACKGROUND

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistive memory, among others. Types of resistive memory include phase change memory (PCM) and resistive random access memory (RRAM), for instance.

Resistive memory devices, such as PCM devices, can include a resistive variable material such as a phase change material, for instance, which can be programmed into different resistance states to store data. The particular data stored in a phase change memory cell can be read by sensing the cell's resistance, e.g., by sensing current and/or voltage variations based on the resistance of the phase change material.

Programming a phase change memory cell to various resistance states can thermally disturb adjacent phase change memory cells. Thermal disturbance of adjacent phase change memory cells can include an undesired change in the resistance of adjacent phase change memory cells. Such thermal disturbance can reduce the reliability of the memory cells by leading to data loss, for instance.

DETAILED DESCRIPTION

Memory cells having heaters with angled sidewalls and methods of forming the same are described herein. As an example, a method of forming an array of resistive memory cells can include forming a first resistive memory cell having a first heater element angled with respect to a vertical plane, forming a second resistive memory cell adjacent to the first resistive memory cell and having a second heater element angled with respect to the vertical plane and toward the first heater, and forming a third resistive memory cell adjacent to the first resistive memory cell and having a third heater element angled with respect to the vertical plane and away from the first heater element.

Embodiments of the present disclosure can provide resistive memory cells having decreased thermal disturbance on adjacent resistive memory cells as compared to previous approaches. Embodiments of the present disclosure can also be more immune to data loss due to thermal disturbance as compared to previous approaches, among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 204 may reference element "4" in FIG. 2, and a similar element may be referenced as 304 in FIG. 3. Also, as used herein, "a number of" a particular element and/or feature can refer to one or more of such elements and/or features.

Figure 1:
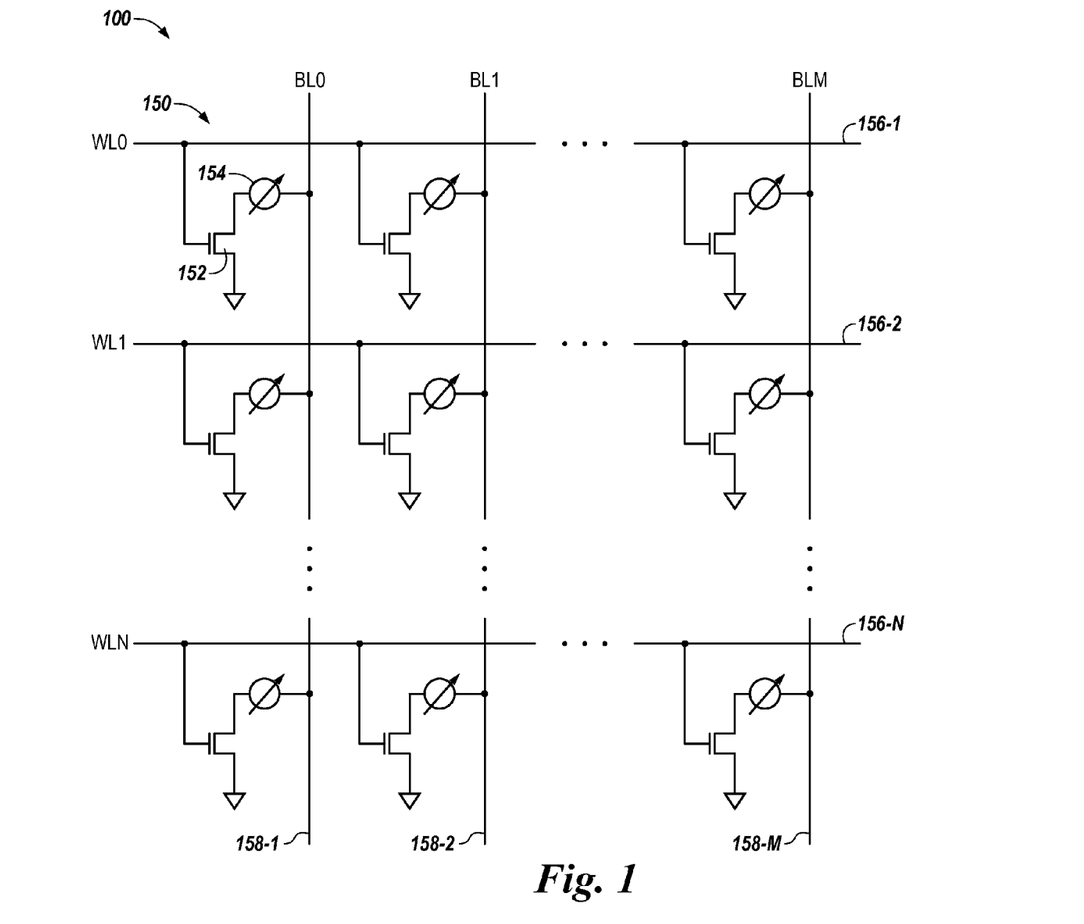
FIG. 1 is a schematic diagram of a portion of a resistive memory array in accordance with a number of embodiments of the present disclosure.

FIG. 1 is a schematic diagram of a portion of a resistive memory array 100 in accordance with a number of the present disclosure. The resistive memory array 100 includes a number of memory cells 150, each including a select device 152 coupled to a resistive storage element 154. The memory cells 150 can be formed in accordance with embodiments described herein. The memory cells 150 can include heater elements, conductive elements, and/or resistive storage elements, among other elements.

The resistive storage elements 154 can include a resistance variable material, e.g., a phase change material. The phase change material can be a chalcogenide, e.g., a Ge—Sb—Te (GST) material such as $Ge_2Sb_2Te_5$, $Ge_1Sb_2Te_4$, $Ge_1Sb_4Te_7$, etc., among other resistance variable materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

The select devices 152 may be field effect transistors, e.g., metal oxide semiconductor field effect transistors (MOSFETs), a bipolar junction transistor (BJT) or a diode, among other types of select devices. Although the select device 152 shown in FIG. 1 is a three terminal select device, the select devices can be two terminal select devices, for instance.

In the example illustrated in FIG. 1, the select device 152 is a gated three terminal field effect transistor. However, embodiments are not limited to a particular type of select device. For instance, the select device 152 can be a bipolar junction transistor or a diode, among other types of select devices. As shown in FIG. 1, a gate of each select device 152 is coupled to one of a number of access lines 156-1, 156-2. . . , 156-N, i.e., each access line 156-1, 156-2, . . . , 156-N is coupled to a row of memory cells 150. The access lines 156-1, 156-2, . . . , 156-N may be referred to herein as "word lines." The designator "N" is used to indicate that the resistive memory array 100 can include a number of access lines.

In the example illustrated in FIG. 1, each resistive storage element 154 is coupled to one of a number of data lines 158-1, 158-2, . . . , 158-M, i.e., each data line 158-1, 158-2, . . . , 158-M is coupled to a column of memory cells 150. The data lines 158-1, 158-2, . . . , 158-M may be referred to herein as "bit lines." The designator "M" is used to indicate that the resistive memory array 100 can include a number of data lines. The designators M and N can have various values. For instance, M and N can be 64, 128, or 256. However, embodiments are not limited to a particular number of word lines and/or bit lines.

The select devices 152 can be operated, e.g., turned on/off, to select/deselect the memory cells 150 in order to perform operations such as programming, e.g., writing, reading, and/or erasing operations. In operation, appropriate voltage and/or current signals, e.g., pulses, can be applied to the bit lines and word lines in order to program data to and/or read data from the memory cells 150. As an example, the data stored by a memory cell 150 of array 100 can be determined by turning on a select device 152, and sensing a current through the resistive storage element 154. The current sensed on the bit line corresponding to the memory cell 152 being read corresponds to a resistance level of the resistance variable material of resistive storage element 154, which in turn may correspond to a particular data state, e.g., a binary value. The resistive memory array 100 can have an architecture other than that illustrated in FIG. 1, as will be understood by one of ordinary skill in the art.

Figure 2:
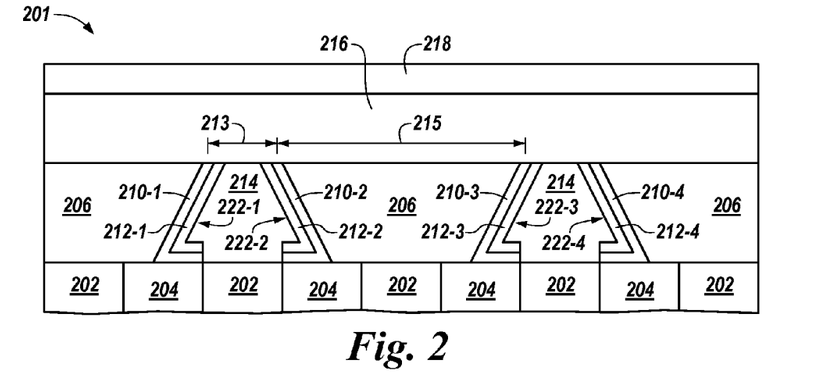
FIG. 2 illustrates a cross-sectional view of a portion of an array of resistive memory cells in accordance with a number of embodiments of the present disclosure.

FIG. 2 illustrates a cross-sectional view of a portion of an array of resistive memory cells 201 in accordance with a number of embodiments of the present disclosure. The memory cells of array 201 can be memory cells such as resistive memory cells 150 shown in FIG. 1. For instance, array 201 can include phase change memory cells. The resistive memory cells illustrated in FIG. 2 include heaters 210-1, 210-2, 210-3, and 210-4 each having an angled vertical portion, e.g., a sidewall that is non-perpendicular with respect to a horizontal base portion. As such, the heaters 210-1 to 210-4 can be referred to as "L-shaped". The array 201 includes a resistance variable material 216, e.g., phase change material, formed between a second conductive material 218 and the heaters 210-1, 210-2, 210-3, and 210-4. In a number of embodiments, the second conductive material 218 can serve as a bit line of the array 201 or can be coupled to a bitline. The heaters 210-1, 210-2, 210-3, and 210-4 are formed on respective first conductive material portions 204. The first conductive material portions 204 can be conductive plugs that are formed between portions of dielectric material 202 and that are coupled to a select device corresponding to a respective memory cell, e.g., select device 152 shown in FIG. 1. As illustrated in FIG. 2, a portion of each respective heater 210-1 to 210-4 interfaces with resistance variable material 216. These heater/resistance variable material interfaces can define active regions associated with the respective memory cell, e.g., regions of the cells that actively change phase responsive to voltages applied to the memory cells.

In the embodiment shown in FIG. 2, the memory cell associated with heater 210-2 is a front to front memory cell in relation to the memory cell associated with heater 210-1, e.g., the horizontal base portions of the L-shaped heaters 210-1 and 210-2 are directed towards each other. The memory cell associated with heater 210-2 is a back to back memory cell in relation to the memory cell associated with heater 210-3, e.g., the horizontal base portions of the L-shaped heaters 210-2 and 210-3 are directed away from each other.

In a number of embodiments, the distance between the heater resistance variable material/heater interfaces associated with front to front memory cells and the distance between the heater resistance variable material/heater interfaces associated with back to back memory cells are different. The difference in the distance between the heater resistance variable material/heater interfaces associated with front to front memory cells and the distance between the heater resistance variable material/heater interfaces associated with back to back memory cells can depend, e.g., can be defined by, the angle of the vertical sidewall portion of the heaters. For instance, in FIG. 2, the distance 213 between the heater/resistance variable material interface corresponding to heater 210-2 and the heater/resistance variable material interface corresponding to heater 210-1 is less than the distance 215 between the heater/resistance variable material interface corresponding to heater 210-2 and the heater/resistance variable material interface corresponding to heater 210-3. The distances 213 and 215 can be adjusted by changing the angles associated with the vertical sidewalls of heaters 210-1/210-2 and/or 210-3/210-4. In a number of embodiments, the vertical sidewalls of heaters can be between 45° and 85° with respect to a horizontal base portion, for example. The particular angles of the vertical sidewalls of the heaters 210-1 to 210-4 can be selected to achieve desired thermal diffusion characteristics associated with the memory cells.

In a number of embodiments, a number of dielectric materials can be located between adjacent heaters. In this example, dielectric materials 212-1, 212-2, and 214 are formed between heaters 210-1 and 210-2 and include dielectric interface 222-1 and 222-2. Dielectric interface 222-1 is the interface between dielectric materials 212-1 and 214. Dielectric interface 222-2 is the interface between dielectric materials 214 and 212-2. Dielectric materials 212-3, 212-4, and 214 are formed between heaters 210-3 and 210-4 and include dielectric interface 222-3 and 222-4. Dielectric interface 222-3 is the interface between dielectric materials 212-3 and 214. Dielectric interface 222-4 is the interface between dielectric materials 214 and 212-4. In this example, dielectric material 206 is the only material located between heaters 210-2 and 210-3. As such, there are no dielectric interfaces between heaters 210-2 and 210-3. The number of dielectric interfaces between adjacent heaters associated with resistive memory cells, as well as the particular dielectric material, can affect the amount of thermal disturbance between adjacent resistive memory cells. The dielectric materials 206, 212-1, 212-2, and 214 can be materials such as oxides, e.g., silicon oxide, and/or nitrides, e.g., silicon nitride, among various other suitable dielectric materials.

In a number of embodiments, the distance between adjacent heater resistance variable material/heater interfaces associated with memory cells and/or the number of and thermal properties of the materials between adjacent phase change memory cells can affect the amount of thermal disturbance between adjacent memory cells when programming a phase change memory cell to various resistance states. The distance between front to front resistive memory cells and the distance between back to back memory cells can be varied by adjusting the angle of the vertical sidewalls of the heaters associated with the memory cells. Also, the number and kind of dielectric interfaces between front to front resistive memory cells and between back to back resistive memory cells can be varied during fabrication resulting in an asymmetry in the thermal gradients between front to front and back to back memory cells. The distance between front to front memory cells, the distance between back to back memory cells, the type of materials and/or number of dielectric interfaces between front to front memory cells, and/or the type of materials and/or the number of dielectric interfaces between back to back memory cells can be varied to provide improved thermal disturb properties over previous approaches.

Figure 3:
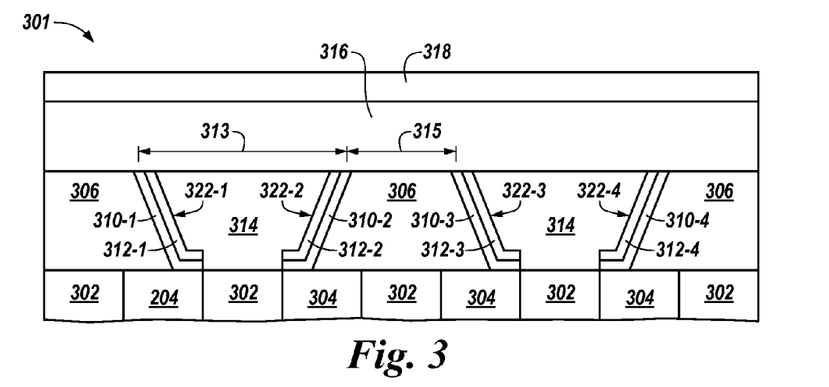
FIG. 3 illustrates a cross-sectional view of a portion of an array of resistive memory cells in accordance with a number of embodiments of the present disclosure.

FIG. 3 illustrates a cross-sectional view of a portion of an array of resistive memory cells 301 in accordance with a number of embodiments of the present disclosure. The memory cells of array 301 can be memory cells such as resistive memory cells 150 shown in FIG. 1. The resistive memory cells illustrated in FIG. 3 include heaters 310-1, 310-2, 310-3, and 310-4 each having an angled vertical portion, e.g., a sidewall that is non-perpendicular with respect to a horizontal base portion. The array 301 includes resistance variable material 316, e.g., phase change material, formed between a conductive cap 318 and the L-shaped heaters 310-1, 310-2, 310-3, and 310-4. As illustrated in FIG. 3, a portion of each respective heater 310-1 to 310-4 interfaces with resistance variable material 316. These heater/resistance variable material interfaces can define active regions associated with the respective memory cell, e.g., regions of the cells that actively change phase responsive to voltages applied to the memory cells.

In the embodiment shown in FIG. 3, the memory cell associated with heater 310-2 is a back to back memory cell in relation to the memory cell associated with heater 310-1, e.g., the horizontal base portions of the L-shaped heaters 310-1 and 310-2 are directed away from each other. The memory cell associated with heater 310-2 is a front to front memory cell in relation to the memory cell associated with heater 310-3, e.g., the horizontal base portions of the L-shaped heaters 310-2 and 310-3 are directed toward each other.

In the embodiment shown in FIG. 3, the distance 313 between the heater/resistance variable material interface corresponding to heater 310-2 and the heater/resistance variable material interface corresponding to heater 310-1 is greater than the distance 315 between the heater/resistance variable material interface corresponding to heater 310-2 and the heater/resistance variable material interface corresponding to heater 310-3. The distances 313 and 315 can be adjusted by changing the angles associated with the vertical sidewalls of heaters 310-1/310-2 and/or 310-3/310-4. In a number of embodiments, the vertical sidewalls of heaters can be between 115° and 155° with respect to a horizontal base portion, for example. The particular angles of the vertical sidewalls of the heaters 310-1 to 310-4 can be selected to achieve desired thermal diffusion characteristics associated with the memory cells.

In a number of embodiments, a number of dielectric materials can be located between adjacent heaters. In this example, dielectric materials 312-1, 312-2, and 314 are formed between heaters 310-1 and 310-2 and include dielectric interface 322-1 and 322-2. Dielectric interface 322-1 is the interface between dielectric materials 312-1 and 314. Dielectric interface 322-2 is the interface between dielectric materials 314 and 312-2. Dielectric materials 312-3, 312-4, and 314 are formed between heaters 310-3 and 310-4 and include dielectric interface 322-3 and 322-4. Dielectric interface 322-3 is the interface between dielectric materials 312-3 and 314. Dielectric interface 322-4 is the interface between dielectric materials 314 and 312-4. In this example, dielectric material 306 is the only material located between heaters 310-2 and 310-3. As such, there are no dielectric interfaces between heaters 310-2 and 310-3. The number of dielectric interfaces between adjacent heaters associated with resistive memory cells, as well as the particular dielectric materials themselves, can affect the amount of thermal disturbance between adjacent resistive memory cells. The dielectric materials 306, 312-1, 312-2, and 314 can be materials such as oxides, e.g., silicon oxide, and/or nitrides, e.g., silicon nitride, among various other suitable dielectric materials.

Figure 4A:
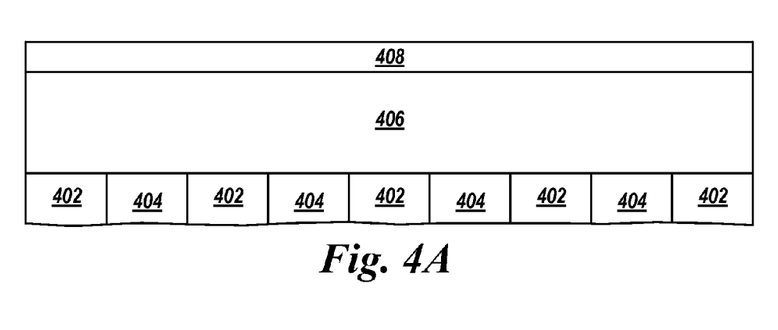
FIGS. 4A-4E illustrate various process stages associated with forming an array of resistive memory cells in accordance with a number of embodiments of the present disclosure.

FIGS. 4A-4E illustrate various process stages associated with forming an array of resistive memory cells in accordance with a number of embodiments of the present disclosure, e.g., array 201 described above. The array of resistive memory cells can be formed using various processing techniques such as atomic material deposition (ALD), physical vapor deposition (PVD), chemical vapor deposition (CVD), supercritical fluid deposition (SFD), various dry and/or wet etch processes, and/or chemical mechanical planarization (CMP), among other suitable processes. As illustrated in FIG. 4A, a method of forming an array resistive memory cells can include forming a number of portions of a conductive material 404, e.g., a number of conductive plugs, each between a number of portions of a dielectric material 402. The conductive plug 404 can include materials such as copper, platinum, tungsten, and/or silver, among various other conductive materials and/or combinations thereof. The conductive plug can be formed using a subtractive approach or a damascene approach, for instance. The first dielectric material 404 can be, for example, a silicon oxide or silicon nitride.

A dielectric material 406 is formed on the conductive plugs 404 and the dielectric material 402. The dielectric material 406 can be silicon nitride ($Si_3N_4$), for example. A planarization process such as a chemical mechanical planarization (CMP) process can be performed on the surface of materials 404 and 402 prior to forming material 406 thereon. A dielectric material 408 can be formed on the dielectric material 406. The dielectric material 408 can be silicon oxide ($SiO_2$), for example.

Figure 4B:
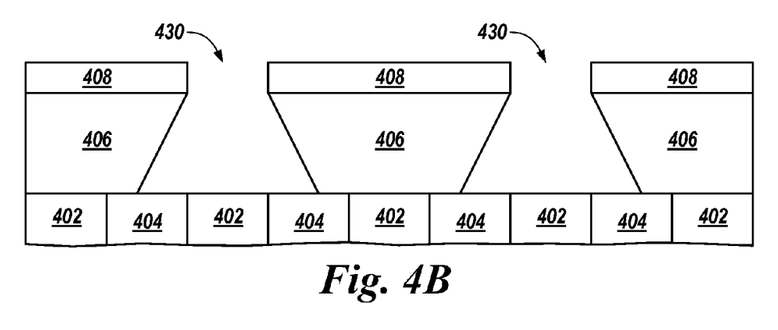

FIG. 4B illustrates a process stage subsequent to that shown in FIG. 4A. In FIG. 4B, portions of the dielectric materials 406 and 208 have been removed, e.g., etched, to form a number of openings 430, e.g., trenches. The openings 430 can be formed using a dry etch chemistry that includes hydrogen bromide, trifluoromethane, sulfur hexafluoride, and oxygen, for instance. The openings 430 can be formed such that they become wider as the etch process approaches the conductive material 404, e.g., such that the openings have a negative profile. The etch process removes portions of the dielectric material 406 and exposes an upper surface of the conductive material 404 and dielectric material 402. The angle of the sidewalls of the openings 430 can define the angle of vertical heater portions subsequently formed. Particular etch chemistries can be selected to form openings 430 having sidewalls of a desired angle.

Figure 4C:
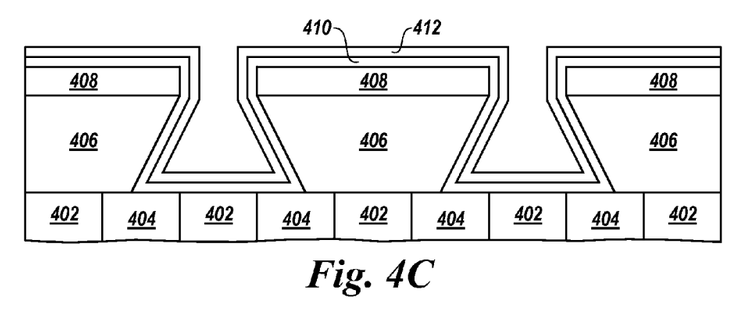

FIG. 4C illustrates a process stage subsequent to that shown in FIG. 4B. A heater material 410 can be formed, e.g., conformally, on the structure shown in FIG. 4B. As such, the heater material 410 is formed on the angled sidewalls of the dielectric material 406 associated with openings 430. As an example, heater material 410 may include titanium, titanium nitride, silicon carbide, graphite, tantalum nitride, tantalum-aluminum nitride, tungsten nitride, aluminum oxide, and/or tantalum oxide, among various other materials and/or combinations thereof. In a number of embodiments, the heater material 410 can be a phase change material such as a chalcogenide material, for instance. That is, in a number of embodiments, a phase change material, e.g., GST, can serve as a heater element of a memory cell. In this example, a dielectric material 412 is formed on the heater material 410. The dielectric material 412 can be formed using a conformal deposition process and can be silicon nitride ($Si_3N_4$), for example.

Figure 4D:
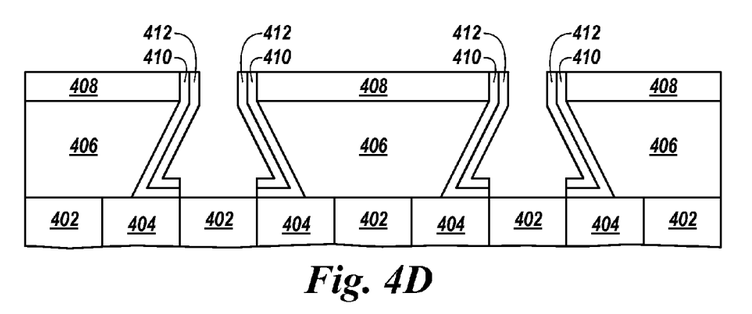

FIG. 4D illustrates a process stage subsequent to that shown in FIG. 4C. As shown in FIG. 4D, portions of the heater material 410 and the dielectric material 412 have been removed. The portions of heater material 410 and dielectric material 412 can be removed, e.g., via an etch back process, to form separate heater elements of adjacent memory cells. As such, the etch back can stop on the materials 402, 404 and/or 408.

Figure 4E:
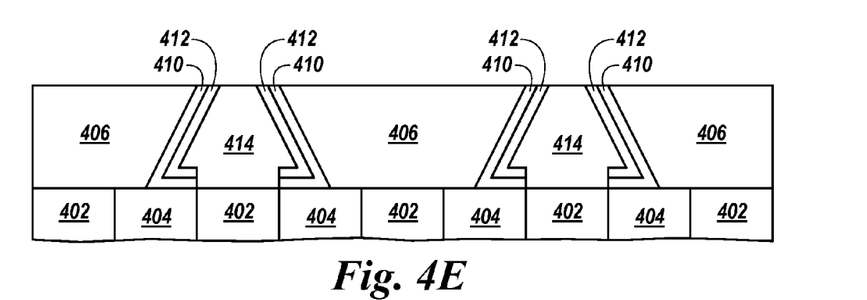

FIG. 4E illustrates a process stage subsequent to that shown in FIG. 4D. As shown in FIG. 4E, a dielectric material 414 can be fanned in the unfilled portions of the openings 430. Portions of the dielectric materials 408 and 414 can be removed, e.g., via a CMP process. The CMP process exposes an interface, e.g., contact surface, of the respective heater elements of the memory cells, e.g., heaters 210-1 to 210-4 shown in FIG. 2.

As shown in FIG. 2, a resistance variable material can be subsequently formed on the structure shown in FIG. 4E, and a conductive cap can be formed on the resistance variable material. In a number of embodiments, a number of bit lines can be formed. The number of bit lines can electrically isolate a first number of memory cells, in an array of memory cells, having heaters with angled sidewalls from a second number of memory cells, in an array of memory cells, having heaters with angled sidewalls.

FIGS. 5A-5E illustrate various process stages associated with forming an array of resistive memory cells in accordance with a number of embodiments of the present disclosure, e.g., array 301 described above. As illustrated in FIG. 4A, a method of forming an array resistive memory cells can include forming a number of portions of a conductive material 504, e.g., a number of conductive plugs, each between a number of portions of a dielectric material 502. The conductive plugs 504 can include materials such as copper, platinum, tungsten, and/or silver, among various other conductive materials and/or combinations thereof. The conductive plugs can be formed using a subtractive approach or a damascene approach, for instance. The dielectric material 502 can be, for example, a silicon oxide or a silicon nitride.

Figure 5A:
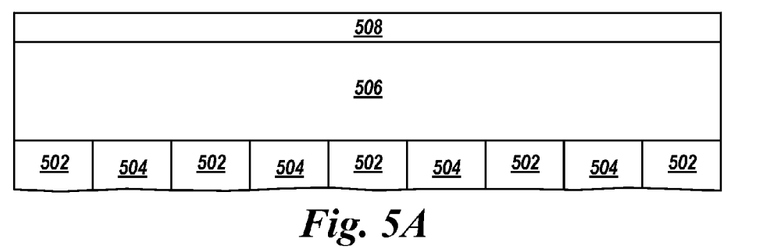
FIGS. 5A-5E illustrate various process stages associated with forming an array of resistive memory cells in accordance with a number of embodiments of the present disclosure.

A dielectric material 506 is formed on the conductive plugs 504 and the dielectric material 502. The dielectric material 506 can be silicon nitride ($Si_3N_4$), for example. A planarization process such as a chemical mechanical planarization (CMP) process can be performed on the surface of the materials 504 and 502 prior to forming material 506 thereon. A dielectric material 508 can be formed on the dielectric material 506. The dielectric material 508 can be silicon oxide ($SiO_2$), for example.

Figure 5B:
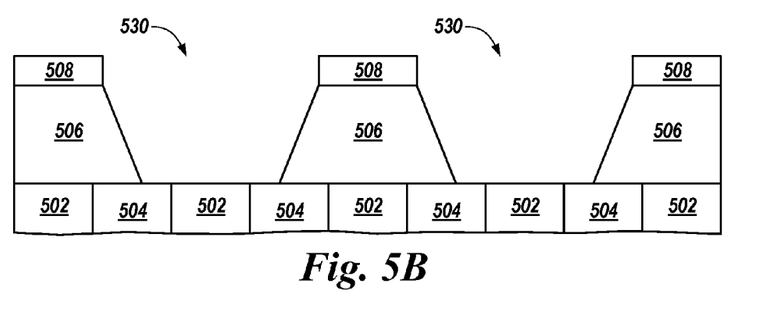

FIG. 5B illustrates a process stage subsequent to that shown in FIG. 5A. In FIG. 5B, portions of the dielectric materials 506 and 508 have been removed, e.g., etched, to form a number of openings 530, e.g. trenches. The openings 530 can be formed such that they become narrower as the etch process approaches the conductive material 504, e.g., such that the openings show a positive profile. The etch process removes portions of dielectric material 506 and exposes an upper surface of the conductive material 504. The angle of the sidewalls of the openings 530 can define the angle of the vertical heater portions subsequently formed. Particular etch chemistries can be selected to form openings 530 having sidewalls of a desired angle.

Figure 5C:
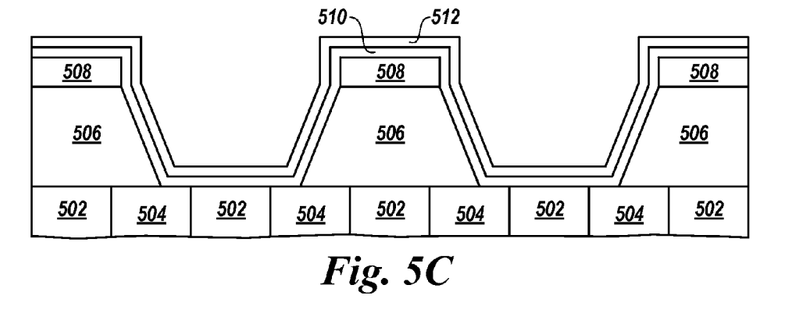

FIG. 5C illustrates a process stage subsequent to that shown in FIG. 5B. A heater material 510 can be formed, e.g., conformally, on the structure shown in FIG. 5B. As such, the heater material 510 is formed on the angled sidewalls of the dielectric material 506 associated with openings 530. As an example, heater material 510 may include titanium, titanium nitride, silicon carbide, graphite, tantalum nitride, tantalum-aluminum nitride, tungsten nitride, aluminum oxide, and/or tantalum oxide, among various other materials and/or combinations thereof. In a number of embodiments, the heater material 510 can be a phase change material such as a chalcogenide material, for instance. That is, in a number of embodiments, a phase change material, e.g., GST, can serve as a heater element of a memory cell. In this example, a dielectric material 512 is formed on the heater material 510. The dielectric material 512 can be formed using a conformal deposition process and can be silicon nitride ($Si_3N_4$), for example.

Figure 5D:
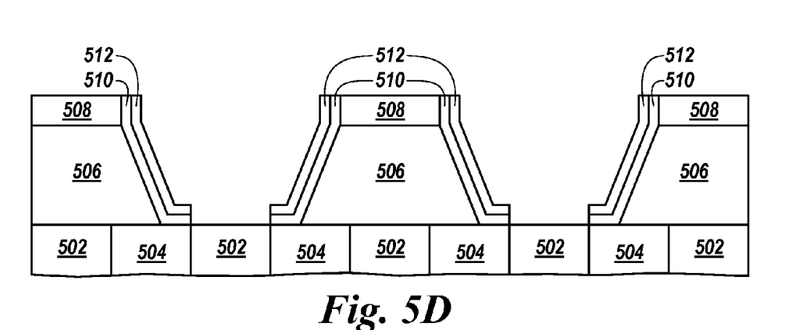

FIG. 5D illustrates a process stage subsequent to that shown in FIG. 5C. As shown in FIG. 5D, portions of the heater material 510 and the dielectric material 512 have been removed. The portions of heater material 510 and dielectric material 512 can be removed, e.g., via an etch back process, to form separate heater elements of adjacent memory cells. As such, the etch back can stop on the materials 502, 504, and/or 508.

Figure 5E:
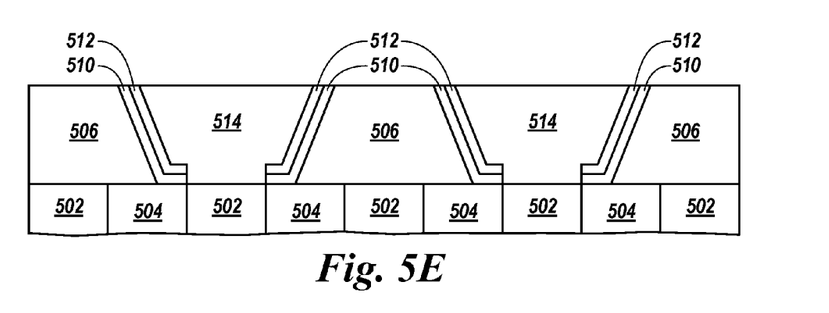

FIG. 5E illustrates a process stage subsequent to that shown in FIG. 5D. As shown in FIG. 5E, a dielectric material 514 can be formed in the unfilled portions of the openings 530. Portions of the dielectric materials 508 and 514 can be removed, e.g., via a CMP process. The CMP process exposes an interface, e.g., contact surface, of the respective heater elements of the memory cells, e.g., heaters 310-1 to 310-4 shown in FIG. 3.

As shown in FIG. 3, a resistance variable material can be subsequently formed on the structure shown in FIG. 5E, and a conductive cap can be formed on the resistance variable material. In a number of embodiments, a number of bit lines can be formed. The number of bit lines can electrically isolate a first number of memory cells, in an array of memory cells, having heaters with angled sidewalls from a second number of memory cells, in an array of memory cells, having heaters with angled sidewalls.

As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting art intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming an array of resistive memory cells, the method comprising:
forming a first resistive memory cell having a first heater element angled with respect to a vertical plane;
forming a second resistive memory cell adjacent to the first resistive memory cell and having a second heater element angled with respect to the vertical plane and toward the first heater;
forming a first dielectric material and a second dielectric material between the first and second resistive memory cells, wherein a sidewall of the first dielectric material that is adjacent to a sidewall of the second dielectric material is at a first angle angled with respect to the vertical plane toward the first heater element, a sidewall of the first dielectric material that is adjacent to a sidewall of the second heater element is at the first angle with respect to the vertical plane toward the first heater element, and a sidewall of the first dielectric material that is adjacent to a sidewall of the first heater element is at a second angle with respect to the vertical plane toward the second heater element that is different than the first angle;
forming a third resistive memory cell adjacent to the first resistive memory cell and having a third heater element angled with respect to the vertical plane and away from the first heater element;
wherein a portion of the first dielectric material in a bottom of an opening in which the first dielectric, first heater element, and second heater element are formed is removed; and
forming a resistance variable material on a planar surface defined by a top surface of each of the first dielectric material, the second dielectric material, the first heater element, and the second heater element.

2. The method claim 1, wherein forming the first heater element, the second heater element, and the third heater element includes forming L-shaped heater elements having a horizontal base portion and a vertically angled wall portion.

3. The method claim 1, wherein forming the first resistive memory cell and the second resistive memory cell includes forming front to front memory cells.

4. The method claim 1, wherein forming the first resistive memory cell and the third resistive memory cell includes forming back to back memory cells.

5. The method of claim 1, including forming different dielectric materials between the first and second resistive memory cells than between the first and third resistive memory cells.

6. The method of claim 1, including forming the first and second dielectric materials between the first and second resistive memory cells and a different number of dielectric materials between the first and third resistive memory cells.

7. The method of claim 6, wherein a number of dielectric materials between the first and second resistive memory cells is greater than the different number of dielectric materials between the first and third resistive memory cells.

8. The method of claim 1, wherein forming the first, second, and third resistive memory cells includes forming phase change memory cells, and wherein at least one of the first, second, and third heater elements is formed of a chalcogenide.

9. A method of forming a number of memory cells, the method comprising:
forming a first dielectric material on a first conductive material and a second dielectric material;
forming a number of openings by removing a number of portions of the first dielectric material, wherein each of the number of openings includes angled sidewalls;
forming a heater material in each of the number of openings;
forming a third dielectric material on the heater material, wherein a first sidewall of the third dielectric material is at a first angle with respect to the vertical plane;
removing a portion of the third dielectric material in a bottom of each of the number of openings and a portion of the heater material in each of the number of openings to form a number of heaters corresponding to a respective number of resistive memory cells;
forming a fourth dielectric material in each of the number of openings, wherein a sidewall of the fourth dielectric material that is adjacent to the first sidewall of the third dielectric material is at the first angle with respect to the vertical plane and wherein a sidewall of the fourth dielectric material that is adjacent to a second sidewall of the third dielectric material is at a second angle with respect to the vertical plane that is different than the first angle;
removing a portion of the first dielectric material, a portion of the heater material, a portion of the third dielectric material, and a portion of the fourth dielectric material to form a planar surface;
forming a resistance variable material on the planar surface; and
forming a conductive cap on the resistance variable material.

10. The method claim 9, wherein the first angle is less than 90° with respect to an upper surface of the first conductive material.

11. The method claim 9, wherein the number of heaters are L-shaped heaters having horizontal base portions and vertically angled wall portions.

12. The method claim 9, wherein forming a number of openings by removing a number of portions of the first dielectric material includes using an etch chemistry that includes hydrogen bromide, trifluoromethane, sulfur hexafluoride, and oxygen.

13. The method claim 9, wherein forming the first dielectric material, forming the third dielectric material, and forming the fourth dielectric material forms a number of dielectric interfaces between the number of heaters.

14. An array of memory cells, comprising:
a first resistive memory cell having a first heater element angled with respect to a vertical plane;
a second resistive memory cell adjacent to the first resistive memory cell and having a second heater element at a first angle with respect to the vertical plane and toward the first heater, wherein a first dielectric material is between the first resistive memory cell and the second resistive memory cell and wherein a sidewall of the first dielectric material that is adjacent to a sidewall of the second heater element is at the first angle with respect to the vertical plane toward the first heater, wherein a sidewall of the first dielectric material that is adjacent to a sidewall of a second dielectric material that is between the first resistive memory cell and the second resistive memory cell is at the first angle with respect to the vertical plane toward the first heater, and wherein a sidewall of the first dielectric material that is adjacent to a sidewall of the first heater element is at a second angle with respect to the vertical plane toward the second heater element that is different than the first angle;

a third resistive memory cell adjacent to the first resistive memory cell and having a third heater element angled with respect to the vertical plane and away from the first heater element, wherein a third dielectric material is between the first resistive memory cell and the third resistive memory cell, wherein a distance between a heater and resistance variable material interface of the first heater element and a heater and resistance variable material interface of the second heater element is less than a distance between the heater and resistance variable material interface of the first heater element and a heater and resistance variable material interface of the third heater element;

wherein a portion of the first dielectric material in a bottom of an opening in which the first dielectric, first heater element, and second heater element are formed is removed; and forming a resistance variable material on a planar surface defined by a top surface of each of the first dielectric material, the second dielectric material, the first heater element, and the second heater element.

15. The array of claim 14, wherein the first and second resistive memory cells are front to front memory cells.

16. The array of claim 14, wherein a first number of dielectric interfaces are between the first heater element and the second heater element and a second number of dielectric interfaces are between the first heater element and the third heater element, the first number of dielectric interfaces being different than the second number of dielectric interfaces.

17. A memory array, comprising:
a number of resistive storage elements;
wherein each of the respective number resistive storage elements include a resistance variable material formed between an L-shaped heater element and a conductive cap material, the L-shaped heater element including a horizontal base portion and an angled vertical wall portion,
wherein at least two adjacent resistive storage elements of the number of resistive storage elements include L-shaped heater elements having their angled vertical wall portions angled towards each other, and
wherein at least two adjacent resistive storage elements of the number of resistive storage elements include L-shaped heater elements having their angled vertical wall portions angled away from each other and wherein a distance between heater and resistance variable material interfaces of the two adjacent resistive storage elements having their angled vertical wall portions angled away from each other is greater than a distance between heater and resistance variable material interfaces of two adjacent resistive storage elements having their angled vertical wall portions angled toward each other,
wherein a first dielectric material and a second dielectric material is between the at least two adjacent resistive storage elements having their angled vertical wall portions angled away from each other, wherein a sidewall of the first dielectric material that is adjacent to a sidewall of the second dielectric material is at a first angle with respect to a vertical plane, wherein a sidewall of the first dielectric material that is adjacent to a sidewall of a second heater element is at the first angle with respect to the vertical plane, and wherein a sidewall of the first dielectric material that is adjacent to a sidewall of a first heater element is at a second angle with respect to the vertical plane that is different than the first angle;
a select device coupled to each of the respective number of resistive storage elements;
wherein a portion of the first dielectric material in a bottom of an opening in which the first dielectric, first heater element, and second heater element are formed is removed; and
forming a resistance variable material on a planar surface defined by a top surface of each of the first dielectric material, the second dielectric material, the first heater element, and the second heater element.

18. The memory array of claim 17, including:
a first number of dielectric interfaces between the at least two adjacent resistive storage elements having angled vertical wall portions angled towards each other; and
a second number of dielectric interfaces between the at least two adjacent resistive storage elements having angled vertical wall portions angled away each other, wherein the first number of dielectric interfaces is different than the second number of dielectric interfaces.

19. The memory array of claim 17, wherein the resistance variable material is a phase change material.

20. The memory array of claim 19, wherein the heater elements are formed of a chalcogenide alloy.

21. The memory array of claim 20, wherein the chalcogenide alloy includes an alloy of germanium, antimony, and tellurium (GST).

* * * * *